US010923461B2

(12) United States Patent
Huang et al.

(10) Patent No.: US 10,923,461 B2
(45) Date of Patent: Feb. 16, 2021

(54) LIGHT-EMITTING MODULE AND TANDEM LIGHT-EMITTING DEVICE

(71) Applicants: BRIGHTEK Optoelectronic (SHENZHEN) Co., Ltd., Shenzhen (CN); BRIGHTEK OPTOELECTRONIC CO., LTD., Taoyuan (TW)

(72) Inventors: Chien-Chung Huang, Taoyuan County (TW); Hsin-Nu Li, Taoyuan County (TW); Jun-Jie He, Shenzhen (CN)

(73) Assignees: BRIGHTEK OPTOELECTRONIC (SHENZHEN) CO., LTD., Shenzhen (CN); BRIGHTEK OPTOELECTRONIC CO., LTD., Taichung (TW)

( * ) Notice: Subject to any disclaimer, the term of this patent is extended or adjusted under 35 U.S.C. 154(b) by 0 days.

(21) Appl. No.: 16/542,184

(22) Filed: Aug. 15, 2019

(65) Prior Publication Data

US 2020/0066698 A1 Feb. 27, 2020

(30) Foreign Application Priority Data

Aug. 23, 2018 (CN) .............................. 201810966699

(51) Int. Cl.
*H01L 25/16* (2006.01)
*H01L 25/075* (2006.01)
(Continued)

(52) U.S. Cl.
CPC ........ *H01L 25/167* (2013.01); *H01L 25/0753* (2013.01); *H01L 25/165* (2013.01); *H01L 33/56* (2013.01); *H01L 33/62* (2013.01)

(58) Field of Classification Search
CPC ... H01L 25/167; H01L 25/0753; H01L 33/62; H01L 31/02
See application file for complete search history.

(56) References Cited

U.S. PATENT DOCUMENTS 8,716,952 B2 * 5/2014 Van De Ven ............. F21K 9/62
  315/294
2009/0267104 A1   10/2009 Hsu et al.
(Continued)

FOREIGN PATENT DOCUMENTS

JP          11251646 A     9/1999
JP       2003304004 A    10/2003
(Continued)

OTHER PUBLICATIONS

Epo, The Partial European Search Report of EP19193041.1 dated Jan. 8, 2020.

*Primary Examiner* — William Coleman
(74) *Attorney, Agent, or Firm* — Li & Cai Intellectual Property (USA) Office

(57) ABSTRACT

A light-emitting module and a tandem light-emitting device include an insulating housing, a control chip, a light-emitting unit, and a plurality of pins. The insulating housing has an upper accommodating space and a lower accommodating space, the lower accommodating space is below the upper accommodating space directly, and the upper accommodating space forms an opening at the upper end of the insulating housing. The control chip is located in the lower accommodating space. The light-emitting unit is located in the upper accommodating space and is electrically connected to the control chip. A plurality of pins are exposed outside the insulating housing. The control chip can receive an electrical signal transmitted by an external control device through the pins to control the illumination of the light-emitting unit.

8 Claims, 15 Drawing Sheets

(51) Int. Cl.
*H01L 33/62* (2010.01)
*H01L 33/56* (2010.01)

(56) References Cited

U.S. PATENT DOCUMENTS

| | | | | |
|---|---|---|---|---|
| 2013/0088522 | A1* | 4/2013 | Gettemy | G09G 3/3406 |
| | | | | 345/690 |
| 2016/0336489 | A1 | 11/2016 | Nishimura et al. | |
| 2020/0075564 | A1* | 3/2020 | Lin | H01L 25/167 |
| 2020/0118989 | A1* | 4/2020 | Wang | H01L 24/81 |

FOREIGN PATENT DOCUMENTS

| | | |
|---|---|---|
| TW | M436944 U1 | 9/2012 |
| TW | M454627 U1 | 6/2013 |
| TW | M556936 U | 3/2018 |

* cited by examiner ly, $cf

LIGHT-EMITTING MODULE AND TANDEM LIGHT-EMITTING DEVICE

CROSS-REFERENCE TO RELATED PATENT APPLICATION

This application claims the benefit of priority to China (P.R.C.) Patent Application No. 201810966699.5 filed on Aug. 23, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting module and a tandem light-emitting device, and more particularly to a light-emitting module including a control chip therein and a tandem light-emitting device having the light-emitting module.

BACKGROUND OF THE DISCLOSURE

The conventional LED module including a control chip cannot be widely used in small-sized electronic devices due to the configuration of the control chip. However, in the aspect of electronic control, compared with the LED module having the control chip disposed outside, the LED module having the control chip disposed therein has advantages such as convenient control. Therefore, for the related art of the LED module, the reduction of the LED module having the control chip therein has become one of the problems that are in dire need of improvement.

SUMMARY OF THE DISCLOSURE

In response to the above-referenced technical inadequacies, the present disclosure provides a light-emitting module and a tandem light-emitting device for improving the size of the light-emitting module, in which the control chip is encapsulated in the related art.

In one aspect, the present disclosure provides a light-emitting module, including: an insulating housing, surrounding an upper accommodating space and a lower accommodating space, a control chip located in the lower accommodating space, at least one light-emitting unit located in the upper accommodating space and electrically connected to the control chip, and a plurality of pins exposed outside the insulating housing. The lower accommodating space is below the upper accommodating space directly, and the upper accommodating space is formed with an opening at an upper end of the insulating housing. A light beam emitted by the light-emitting unit can be outwardly emitted through the opening. The control chip can receive an electrical signal transmitted by an external control device through the pins to control the light-emitting unit.

In certain embodiments, the light-emitting module further includes a substrate, the substrate is disposed in the insulating housing and located between the upper accommodating space and the lower accommodating space, and two opposite sides of the substrate are defined as a first mounting surface and a second mounting surface. The first mounting surface is exposed from the upper accommodating space, and the second mounting surface is exposed from the lower accommodating space. The light-emitting unit is mounted on the first mounting surface, and the control chip is mounted on the second mounting surface.

In certain embodiments, the substrate includes a plurality of conductive channels, the light-emitting unit is electrically connected to the control chip through at least one conductive channel, and at least one conductive channel is electrically connected to the pin.

In certain embodiments, the light-emitting module includes a plurality of lead frames, the light-emitting unit is electrically connected to the control chip through the lead frame, and a part of the lead frame is exposed from the insulating housing to form the pin.

In certain embodiments, the upper accommodating space and the lower accommodating space are each filled with a colloid, the light-emitting unit is electrically connected to the first mounting surface through at least one metal wire or solder joint, and the control chip is electrically connected to the second mounting surface through at least one metal wire or solder joint.

In certain embodiments, each of the light-emitting unit and the control chip does not protrude from the insulating housing.

In certain embodiments, the light-emitting module has three light-emitting units, a red light emitting diode chip, a blue light emitting diode chip and a green light emitting diode chip, respectively. An illumination range of any one of the red light emitting diode chip, the green light emitting diode chip, and the blue light emitting diode chip, and an illumination range of at least one of the remaining light emitting diode chips partially overlap.

In certain embodiments, the upper accommodating space is in communication with the lower accommodating space, the light-emitting module further includes a substrate, the substrate is disposed at a lower end of the insulating housing, a wide side of the substrate is exposed from the lower accommodating space, the control chip is mounted on the wide side of the substrate exposed from the lower accommodating space, and the light-emitting unit is mounted on a side of the control chip opposite to the substrate.

In one aspect, the present disclosure provides a tandem light-emitting device, including: a light-emitting module and at least one tandem module. The light-emitting module includes: an insulating housing surrounding an upper accommodating space and a lower accommodating space, a control chip located in the lower accommodating space, at least a first light-emitting unit located in the upper accommodating space and electrically connected to the control chip, and a plurality of pins exposed outside the insulating housing. The lower accommodating space is located directly below the upper accommodating space, and the upper accommodating space is formed with an opening at an upper end of the insulating housing. A light beam emitted by the first light-emitting unit can be emitted outwardly through the opening. The tandem module includes at least one second light-emitting unit, and the second light-emitting unit is electrically connected in series with the first light-emitting unit. The control chip can receive an electrical signal transmitted by an external control device through the pins to simultaneously control the first light-emitting unit and the second light-emitting unit to emit light.

In certain embodiments, the light-emitting module has three first light-emitting units, a first red light emitting diode chip, a first a blue light emitting diode chip and a first green light emitting diode chip, respectively. An illumination range of any one of the first red light emitting diode chip, the first green light emitting diode chip, and the first blue light emitting diode chip, and an illumination range of at least one of the remaining light emitting diode chips partially overlap. The tandem module has three second light-emitting units, a second red light emitting diode chip, a second blue light emitting diode chip and a second green light emitting diode chip, respectively. An illumination range of any one of the second red light emitting diode chip, the second green light emitting diode chip, and the second blue light emitting diode chip, and an illumination range of at least one of the remaining light emitting diode chips partially overlap. The first red light emitting diode chip is electrically connected in series with the second red light emitting diode chip, the first blue light emitting diode chip is electrically connected in series with the second blue light emitting diode chip, and the first green light emitting diode chip is electrically connected in series with the second green light emitting diode chip.

Therefore, by disposing the control chip and the light-emitting units respectively on the opposite sides of the substrate or the plurality of lead frames, or for example, disposing the control chip vertically with the light-emitting unit, the overall size of the light-emitting module can be greatly reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
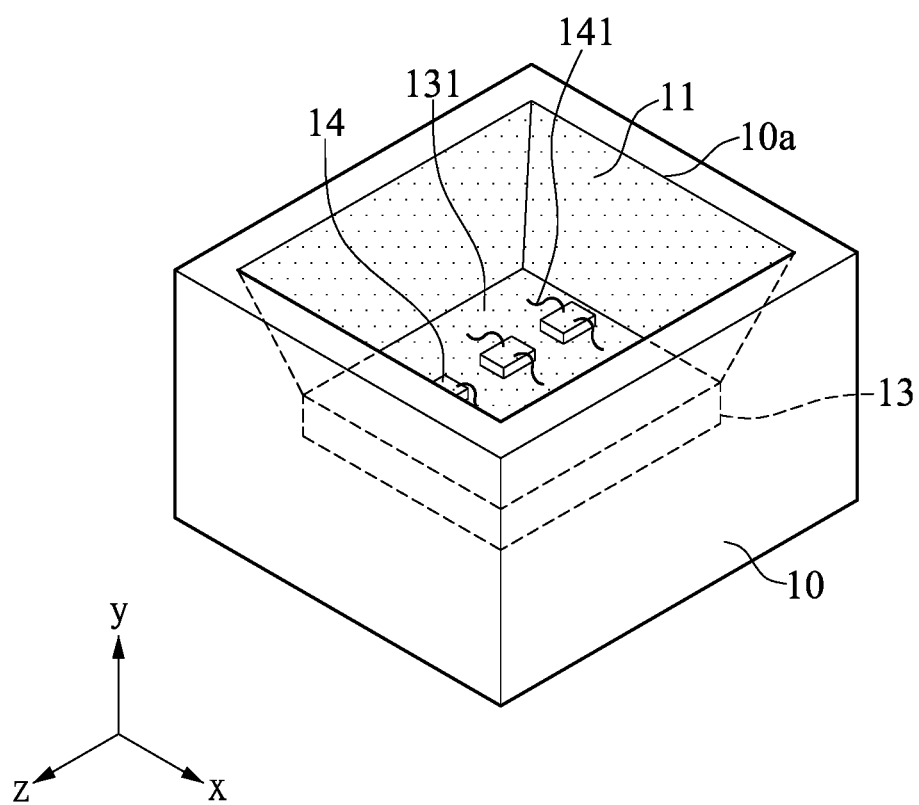
FIG. 1 is a perspective schematic view of a light-emitting module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
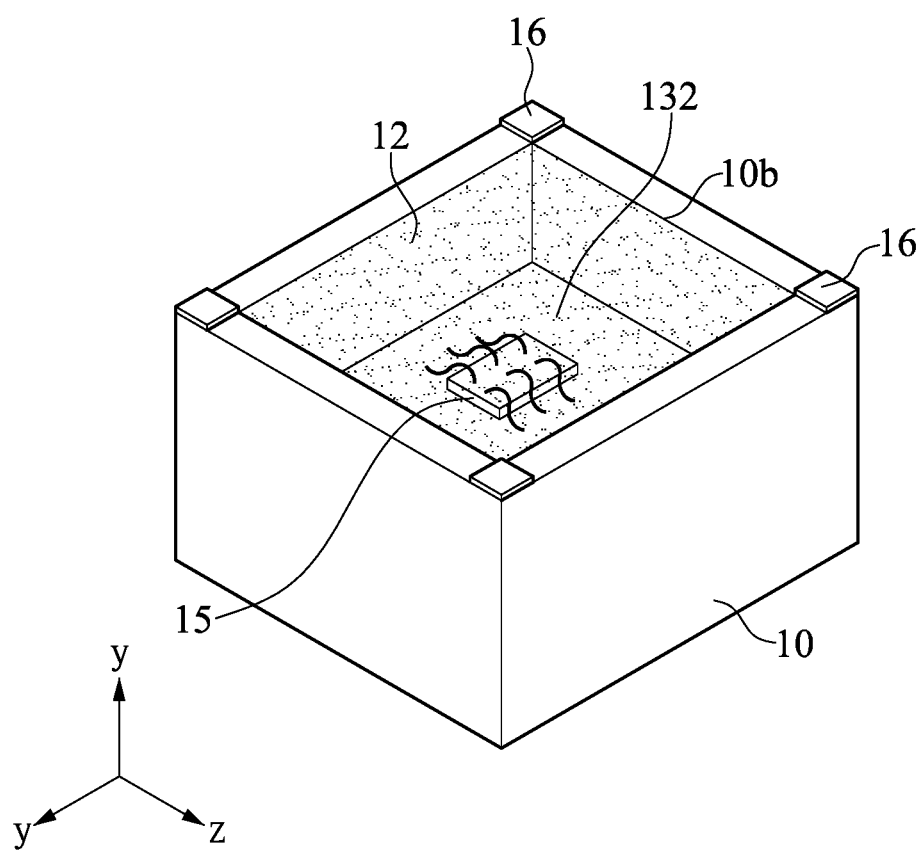
FIG. 2 is a perspective schematic view from another angle of the light-emitting module according to the first embodiment of the present disclosure.
Figure 3:
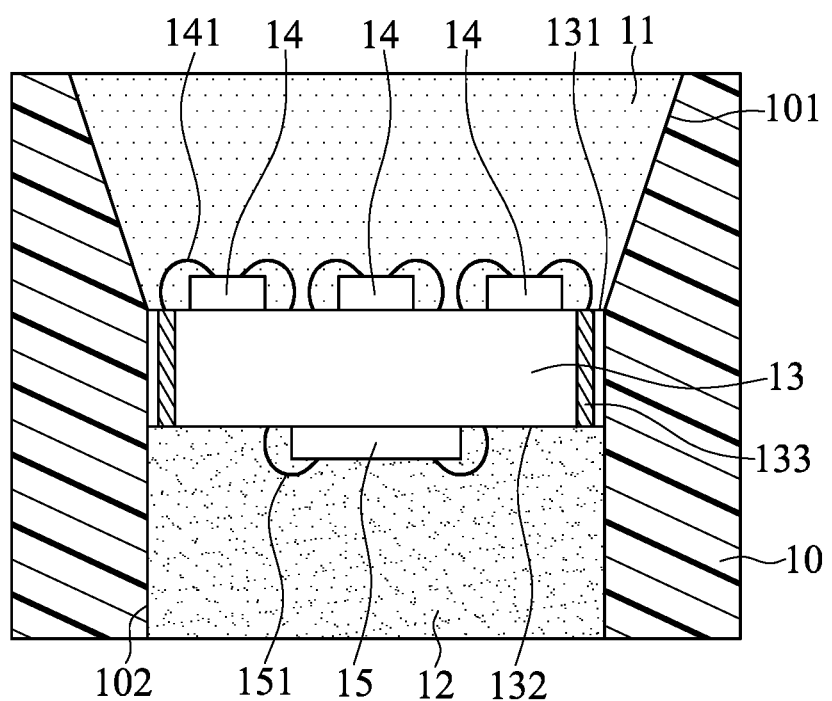
FIG. 3 is a cross-sectional view of the light-emitting module according to the first embodiment of the present disclosure.
Figure 3:
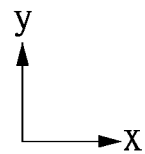

Referring to FIG. 1 to FIG. 3, FIG. 1 and FIG. 2 are perspective schematic views of a light-emitting module according to a first embodiment of the present disclosure, and FIG. 3 is a cross-sectional view of the light-emitting module according to the first embodiment of the present disclosure. As shown, the light-emitting module 100 includes an insulating housing 10, a substrate 13, three light-emitting units 14, a control chip 15, and four pins 16.

Figure 4:
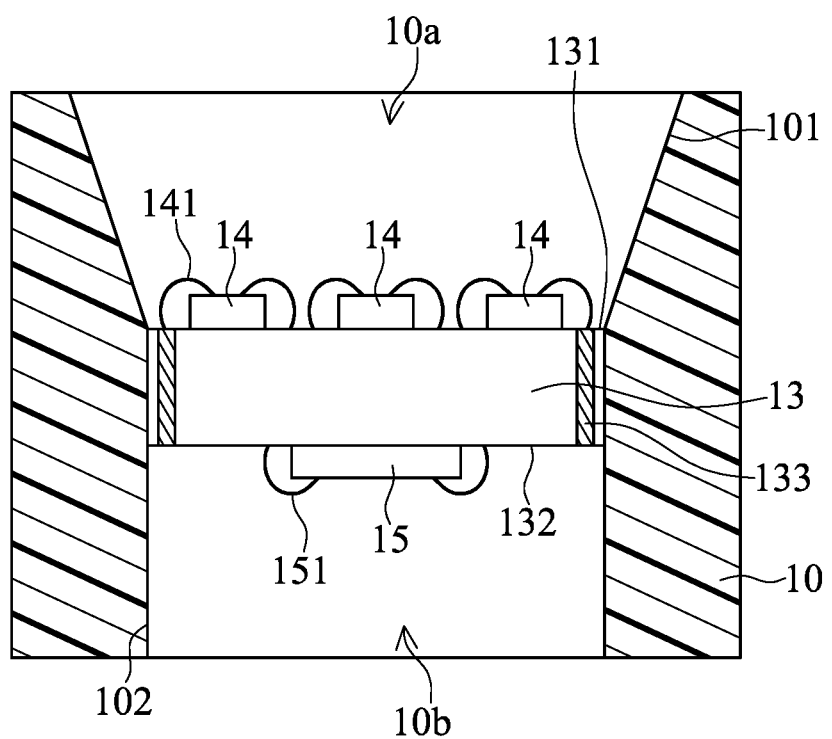
FIG. 4 is a cross-sectional view of the light-emitting module according to one embodiment of the present disclosure.
Figure 4:
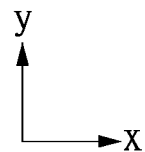

Two opposite ends of the insulating housing 10 are concavely formed with a first groove 101 and a second groove 102, respectively. An upper accommodating space 10a is in the first groove 101 (as shown in FIG. 4), and a lower accommodating space 10b is in the second groove 102 (as shown in FIG. 4). The upper accommodating space 10a and the lower accommodating space 10b are surrounded by the insulating housing 10, the lower accommodating space 10b is located directly below the upper accommodating space 10a, and the upper accommodating space 10a is formed with an opening at an upper end of the insulating housing 10.

In practical applications, the appearance of the first groove 101 and the second groove 102 may be changed according to requirements, and only one of the embodiments is shown. The lower accommodating space 10a of the first groove 101 and the lower accommodating space 10b of the second groove 102 are essentially not communicated to each other, but the present disclosure is not limited thereto. In practical applications, a sidewall forming the upper accommodating space 10a, that is, a sidewall of the first groove 101, may be provided with a reflective layer (not shown), and the sidewall forming the upper accommodating space 10a may also be inclined. This can assist with the guidance of a light beam emitted by one of the light-emitting units 14. In an actual implementation, the upper accommodating space 10a of the first groove 101 may be filled with a transparent colloid 11, and the lower accommodating space 10b of the second groove 102 may be filled with a packaging colloid 12, but the present disclosure is not limited thereto. As shown in FIG. 4, in a special application, the upper accommodating space 10a and the lower accommodating space 10b may not be filled with any colloid. Alternatively, in different embodiments, only one of the upper accommodating space 10a and the lower accommodating space 10b may be filled with a colloid. The colloid filled in the upper accommodating space 10 must be a light-transmitting gel to allow the light beam emitted from the light-emitting unit 14 disposed in the upper accommodating space 10a to be emitted outwardly. The colloid filled in the lower accommodating space 10b is not limited to being light transmissive or opaque.

The substrate 13 is disposed in the insulating housing 10, and the substrate 13 is located between the first groove 101 and the second groove 102, that is, between the upper accommodating space 10a and the lower accommodating space 10b. Two wide sides opposite to each other of the substrate 13 are defined as a first mounting surface 131 and a second mounting surface 132, respectively. The first mounting surface 131 is exposed at the bottom of the first groove 101, i.e., exposed in the upper accommodating space 10a, and the second mounting surface 132 is exposed at the bottom of the second groove 102, i.e., exposed in the lower accommodating space 10b.

As shown in FIG. 3, the substrate 13 may include a plurality of conductive channels 133. Specifically, the substrate 13 may be any type of circuit board, and the first mounting surface 131 and the second mounting surface 132 may be formed by etching or the like to form a conductive wiring structure (a layout) and a plurality of pads, and the like. The conductive channel 133 may be formed by a through hole formed in the substrate 13 and a conductive material filled in the through hole. The structure of the conductive wiring structure and the pads formed on the first mounting surface 131 and the second mounting surface 132 may be based on the type of the light-emitting units 14, the number of the light-emitting units 14, the type of the control chip 15, and the number of the pin 16 of the light-emitting module 100, but the present disclosure is not limited thereto. The number of the conductive channels 133 and the positions thereof may be determined according to the positions where the control chip 15 and the light-emitting units 14 are disposed on the substrate 13. The control chip 15 may be, for example, a driving chip for driving the light-emitting units 14 to light up, or a microprocessor of various types. It is worth mentioning that, in a specific application, in order to prevent the control chip 15 from being unintentionally destroyed, the control chip 15 does not protrude from the insulating housing 10 when the control chip 15 is disposed in the lower accommodating space 10b.

As shown in FIG. 3, the three of the light-emitting units 14 are mounted on the first mounting surface 131, and each of the light-emitting units 14 is electrically connected to the conductive wiring structure on the first mounting surface 131 through a plurality of metal wires 141 and electrically connected to the conductive channel 133 in the substrate 13. The three light-emitting units 14 mounted onto the first mounting surface 131 are located in the upper accommodating space 10a of the first groove 101, the three light-emitting units 14 are covered by the light-transmitting colloid 11 filled in the first groove 101, and the light beams emitted by the three light-emitting units 14 can be emitted outwardly through the transparent colloid 11.

In practical applications, the three light-emitting units 14 can be a red light emitting diode chip, a blue light emitting diode chip and a green light emitting diode chip. The red light emitting diode chip can emit a light beam with a wavelength of 610 nm to 780 nm, the blue light emitting diode chip can emit a light beam with a wavelength of 450 nm to 495 nm, and the green light emitting diode chip can emit a light beam with a wavelength of 500 nm to 570 nm. An illumination range of any one of the red light emitting diode chip, the blue light emitting diode chip, and the green light emitting diode chip can partially overlap an illumination range of at least one of the remaining light emitting diode chips, and the light beams emitted by the red light emitting diode chip, the blue light emitting diode chip and the green light emitting diode chip can be mixed with each other to form a mixed light beam. In particular, the light-emitting unit 14 may be any light-emitting chip, such as a light-emitting chip capable of emitting infrared light or ultraviolet (UV) light, and the present disclosure is not limited to the above red light emitting diode chip, blue light emitting diode chip and green light emitting diode chip. In the present embodiment, the light-emitting unit 14 capable of emitting different colors of light is taken as an example, but not limited thereto. In a specific embodiment, the light-emitting module 100 may have four or more light-emitting units 14 and wavelengths of the light beams that can be emitted by the light-emitting unit 14 may be the same as each other, or may be completely different, or the wavelength of the light beams emitted by the partial light-emitting unit 14 may be the same.

It is worth mentioning that, in a specific application, in order to prevent the light-emitting unit 14 from being unintentionally destroyed, the light-emitting unit 14 does not protrude from the insulating housing 10 when the light-emitting unit 14 is disposed in the upper accommodating space 10a. In a case that a plurality of light-emitting units 14 are disposed in the upper accommodating space 10a, the plurality of light-emitting units 14 do not protrude from the insulating housing 10 makes, the light beams emitted by the light-emitting units 14 be sufficiently mixed with each other in the upper accommodating space 10a and then be emitted outwardly from the opening at the upper end of the insulating housing 10.

The control chip 15 is mounted on the second mounting surface 132, and the control chip 15 is electrically connected to the conductive wiring structure on the second mounting surface 132 through a plurality of metal wires 151. The control chip 15 can be electrically connected to the three light-emitting units 14 through the conductive channels 133 in the substrate 13. The manner in which the control chip 15 is electrically connected to the three light emitting units 14 is not limited to be through the conductive channels 133 of the substrate 13, and any manner in which the control chip 15 can be electrically connected to the three light-emitting units 14 is within the scope of the present embodiment. The control chip 15 is located in the lower accommodating space 10*b* in the second groove 102, the control chip 15 is wrapped in the packaging colloid 12 filled in the second groove 102, and the control chip 15 is not exposed from the insulating housing 10 or the packaging colloid 12. The packaging colloid 12 may be an opaque structure or a light transmitting structure, but the present disclosure is not limited thereto.

The second groove 102 is only used to expose the second mounting surface 132 of the substrate 13 in the lower accommodating space 10*b*, so that the control chip 15 can be disposed on the second mounting surface 132. Therefore, the size and shape of the lower accommodating space 10*b* of the second groove 102 are substantially designed according to the size of the control chip 15, and the size and shape of the lower accommodating space 10*b* of the second groove 102 has no absolute relationship with the size and appearance of the upper accommodating space 10*a* of the first groove 101. By disposing the second groove 102 below the first groove 101 directly (meaning that the lower accommodating space 10*b* is below the upper accommodating space 10*a* directly), the overall size of the light-emitting module 100 can be effectively reduced.

As shown in FIG. 2, a plurality of pins 16 are exposed outside the insulating housing 10, part of the pins 16 are electrically connected to the light-emitting units 14, and other part of the pins 16 are electrically connected to the control chip 15. The pins 16 may be electrically connected to the plurality of light-emitting units 14 and the control chip 15 through the conductive wiring structure on the first mounting surface 131 of the substrate 13, the conductive wiring structure on the second mounting surface 132, and the plurality of conductive channels 133. In particular, the pin 16 herein is a structure for soldering the light-emitting module 100 to an associated electronic component. In a specific implementation, the pin 16 may be a structure extending from the substrate 13, or the pin 16 may be a metal member independent of the substrate 13, and one end of the pin 16 is mounted onto the substrate 13, and the other end of the pin 16 is exposed outside the insulating housing 10. The control chip 15 can receive an electrical signal transmitted by the external control device through the pin 16 to control brightness or color temperature of the light beam emitted by the light-emitting unit 14. The number and appearance of pins 16 may be changed according to requirements, and is not limited to those shown in the figures.

Figure 5:
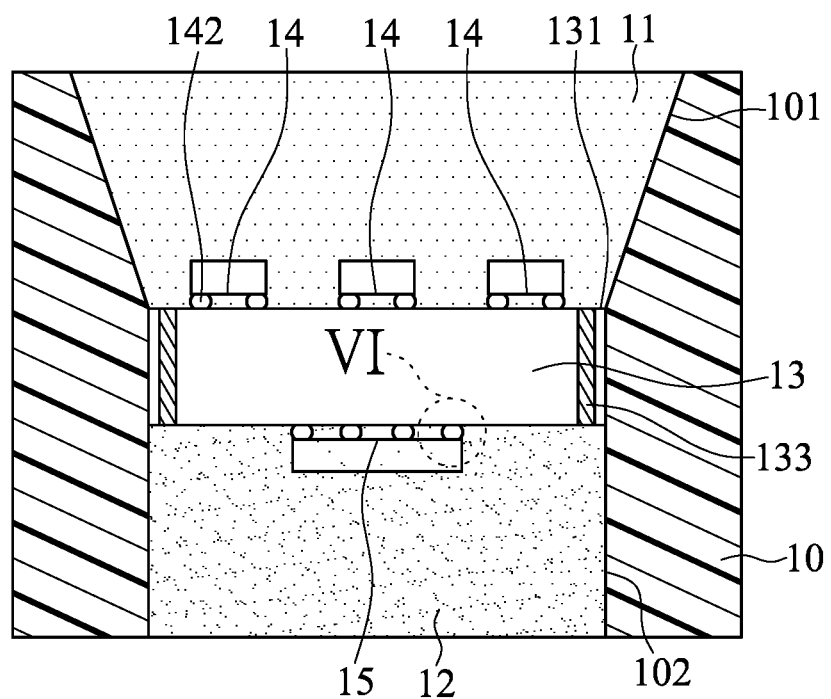
FIG. 5 is a cross-sectional view of a light-emitting module according to a second embodiment of the present disclosure.
Figure 6:
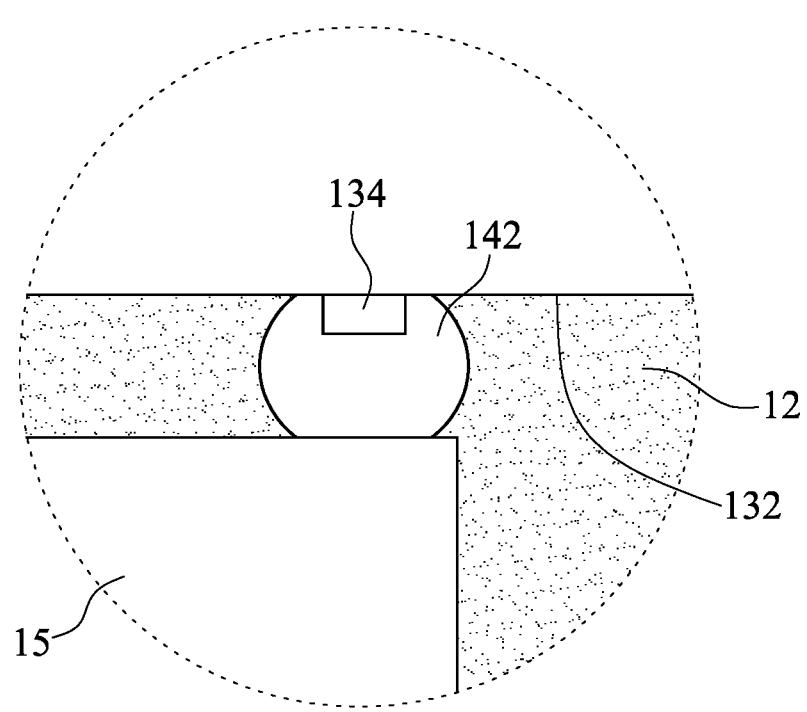
FIG. 6 is an enlarged schematic view of FIG. 5.

Referring to FIG. 5 and FIG. 6, FIG. 5 is a cross-sectional view of a light-emitting module according to a second embodiment of the present disclosure, and FIG. 6 is an enlarged schematic view of FIG. 5. As shown in the FIGs, the difference between the present embodiment and the foregoing embodiment is that each light-emitting unit 14 may be interconnected with a plurality of pads 134 disposed on the first mounting surface 131 through solder joints 142, and the control chip 15 may be interconnected with the plurality of pads 134 disposed on the second mounting surface 132 through the solder joints 142. The plurality of pads 134 disposed on the first mounting surface 131 and the second mounting surface 132 are electrically connected to the conductive channels 133 disposed in the substrate 13.

Specifically, in the process of installing the light-emitting units 14 and the control chip 15, solder balls (for example, tin balls) are disposed at the positions where the light-emitting units 14 and the control chip 15 are to be electrically connected, the light-emitting units 14 and the control chip 15 disposed with the solder balls are disposed directly on the plurality of pads 134 on the first mounting surface 131 and the second mounting surface 132, and then the solder balls are subjected to a curing operation to form the solder joints 142 between the light-emitting units 14 and the pads 134 and between the control chip 15 and the pads 134. Thus, the manufacturing method does not require the use of the metal wires described in the foregoing embodiments, so that the yield of correctly mounting the light-emitting units 14 or the control chip 15 on the substrate 13 can be greatly improved.

It should be noted that, in practical applications, the light-emitting units 14 and the control chip 15 may be arranged on the substrate 13 in the manner of the present embodiment or the foregoing embodiment, depending on manufacturing requirements. For example, in the same light-emitting module 100, the light-emitting units 14 may be electrically connected to the substrate 13 through a plurality of metal wires 141, and the control chip 15 may be electrically connected to the substrate 13 through the plurality of solder joints 142. Alternatively, in the same light-emitting module 100, the light-emitting unit 14 can be electrically connected to the substrate 13 through a plurality of solder joints 142, and the control chip 15 is electrically connected to the substrate 13 through a plurality of metal wires 151.

Figure 7:
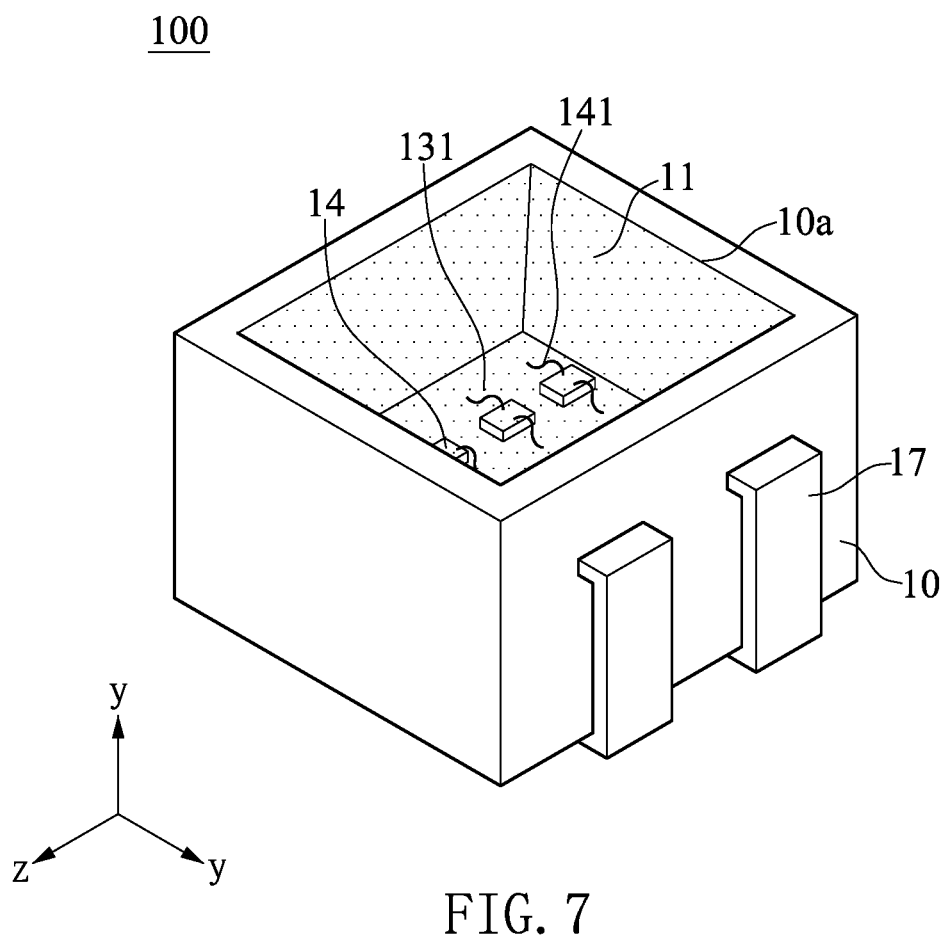
FIG. 7 is a perspective schematic view of a light-emitting module according to a third embodiment of the present disclosure.
Figure 8:
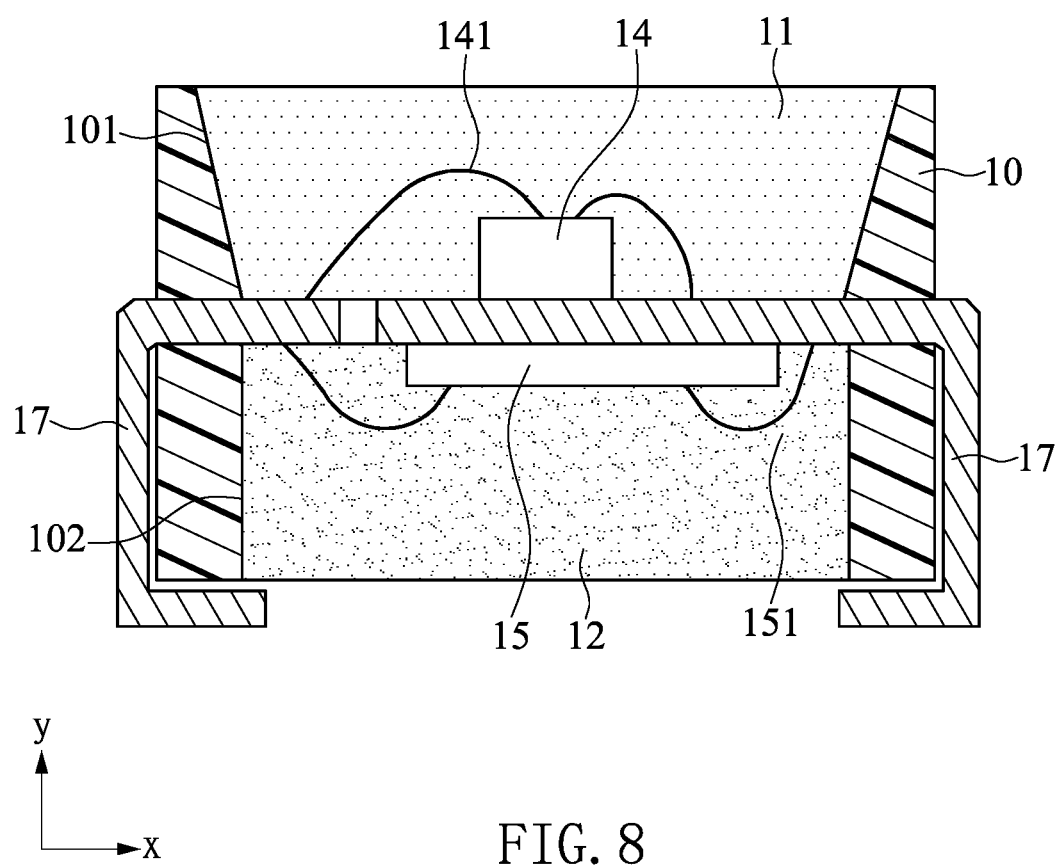
FIG. 8 is a cross-sectional view of the light-emitting module according to the third embodiment of the present disclosure.
Figure 9:
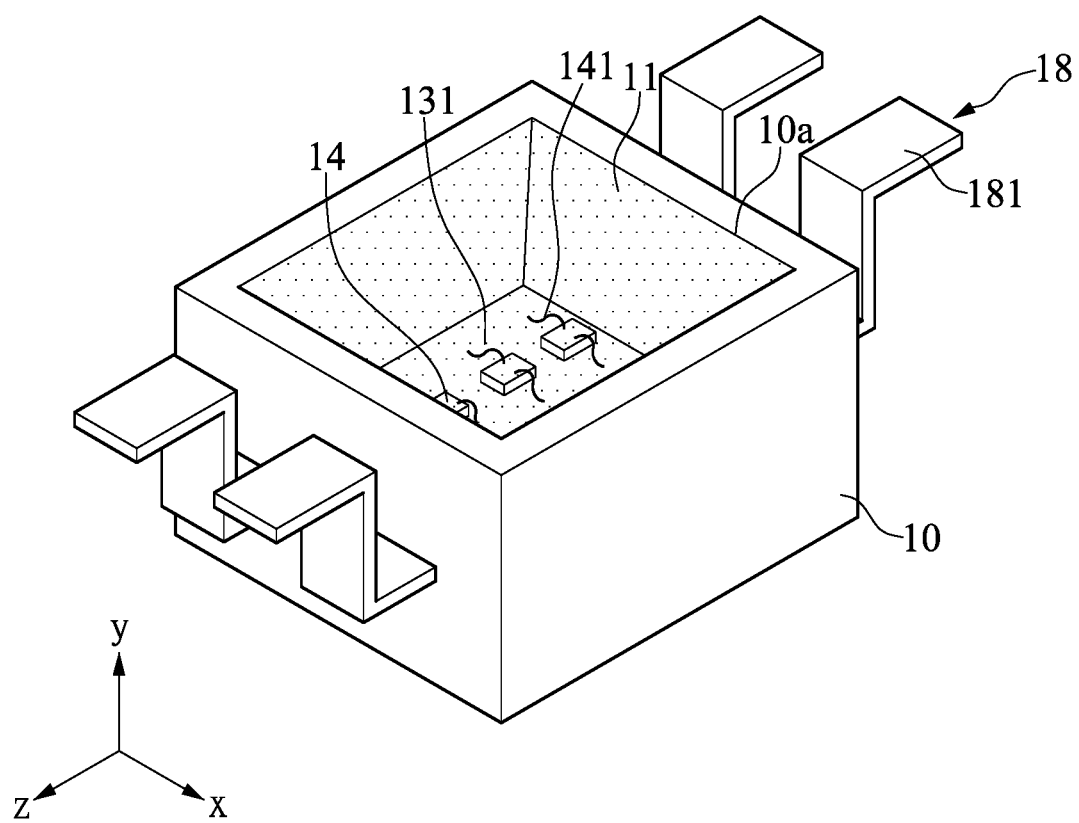
FIG. 9 is a perspective schematic view of a light-emitting module according to a fourth embodiment of the present disclosure.
Figure 10:
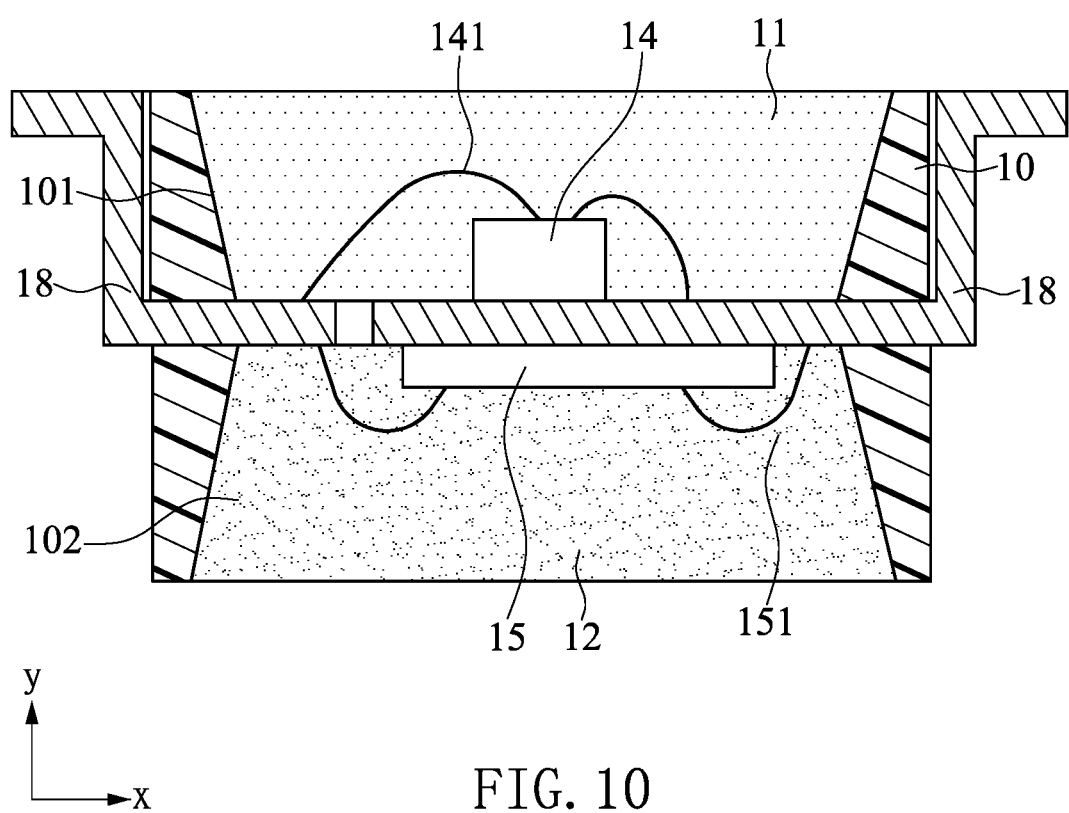
FIG. 10 is a cross-sectional view of the light-emitting module according to the fourth embodiment of the present disclosure.

Referring to FIG. 7 to FIG. 10, FIG. 7 and FIG. 8 are schematic views of a light-emitting module according to a third embodiment of the present disclosure. FIG. 9 and FIG. 10 are schematic views of a light-emitting module according to a fourth embodiment of the present disclosure. As shown in FIG. 7 and FIG. 8, the difference between the present embodiment and the foregoing embodiment is that the light-emitting module 100 may not include the aforementioned substrate 13 but includes a plurality of lead frames 17. The following description describes only the lead frame 17, and descriptions of other components can be referred to in the foregoing embodiment, and details are not described herein again.

Two opposite sides of the lead frames 17 are exposed from the first groove 101 and the second groove 102, respectively, that is, the lead frames 17 are exposed from the upper accommodating space 10*a* of the first groove 101 and the lower accommodating space 10*b* of the second groove 102, respectively. A portion of each lead frame 17 is exposed outside the insulating housing 10 as the pin 16 described in the foregoing embodiment. Detailed descriptions of the pin 16 can be referred to in the foregoing embodiment, and details are not described herein again.

The plurality of light-emitting units 14 are mounted on a portion of the lead frames 17 exposed from the upper accommodating space 10*a* of the first groove 101, the plurality of light-emitting units 14 are located in the upper accommodating space 10*a*, and each light-emitting unit 14 is electrically connected to at least part of the lead frames 17 through a plurality of first metal wires 141. The plurality of light-emitting units 14 and the plurality of first metal wires 141 are covered together by the light-transmitting colloid 11. The number of the lead frames 17 may be determined according to the number of the light-emitting units 14 and the type of the control chip 15, and is not limited thereto; and the number can be, for example, four, six, or eight.

The control chip 15 is mounted on a portion of the lead frames 17 exposed from the lower accommodating space 10*b* of the second groove 102, and the control chip 15 is electrically connected to at least a portion of the lead frames 17 through the plurality of second metal wires 151. The control chip 15 and the plurality of second metal wires 151 are covered by a packaging colloid 12. The control chip 15 is electrically connected to the plurality of light-emitting units 14 through a plurality of second metal wires 151 and lead frames 17 electrically connected to the second metal wires 151. Thereby, the control chip 15 can receive the electrical signals transmitted by the external control device through the plurality of lead frames 17 to correspondingly control the brightness or color temperature of the light beams emitted by the light-emitting units 14, respectively.

As shown in FIG. 9 and FIG. 10, the appearance of the lead frame 18 exposed outside the insulating housing 10 may vary depending on different environments, and is not limited to those shown in FIGS. 7 and 8. Specifically, a soldering surface 181 of the pin formed by the lead frame 18 may be substantially flush with the light emitting surface of the light-emitting module 100.

Figure 11:
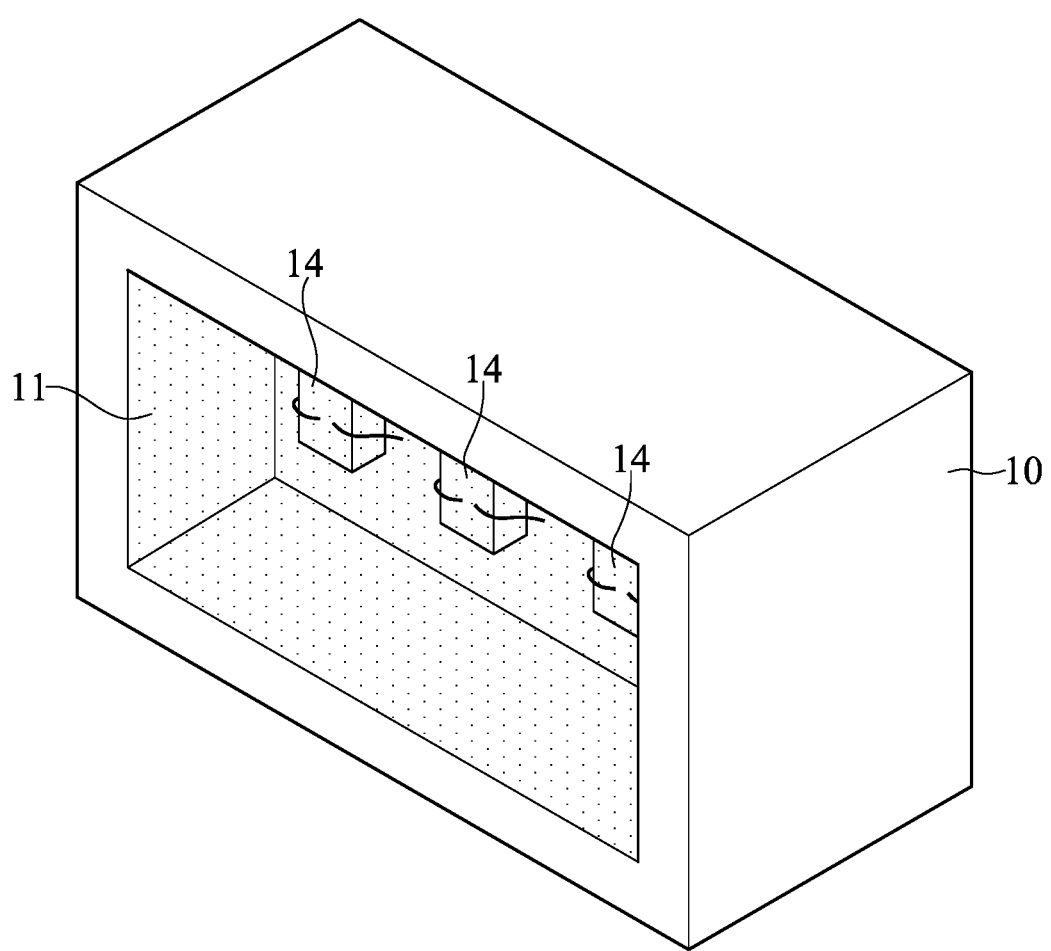
FIG. 11 is a perspective schematic view of a light-emitting module according to a fifth embodiment of the present disclosure.
Figure 12:
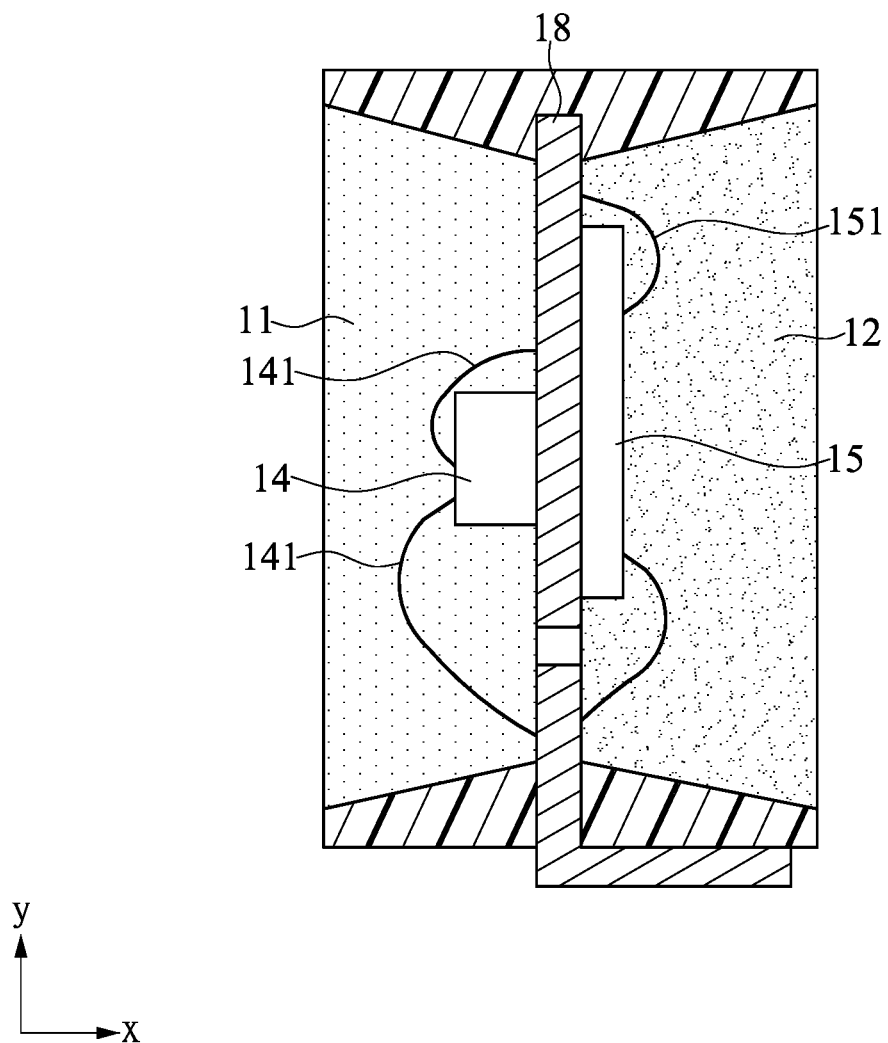
FIG. 12 is a cross-sectional view of the light-emitting module according to the fifth embodiment of the present disclosure.

Referring to FIG. 11 to FIG. 12, FIG. 11 is a perspective schematic view of a light-emitting module according to a fifth embodiment of the present disclosure, and FIG. 12 is a cross-sectional view. As shown, the difference between the present embodiment and the foregoing third and fourth embodiments is that, shape of the lead frame 18 can be changed according to actual needs. Specifically, the lead frames 18 of the embodiment are only exposed on one side of the insulating housing 10, and the light-emitting module 100 may be mounted onto the circuit board directly by the portion of the lead frames 18 exposed on the side of the insulating housing 10, so that the light-emitting module 10 can be used as a side illuminating light source. Details of other components of the light-emitting module in this embodiment are substantially the same as that of the foregoing embodiments, and are not described herein again.

Figure 13:
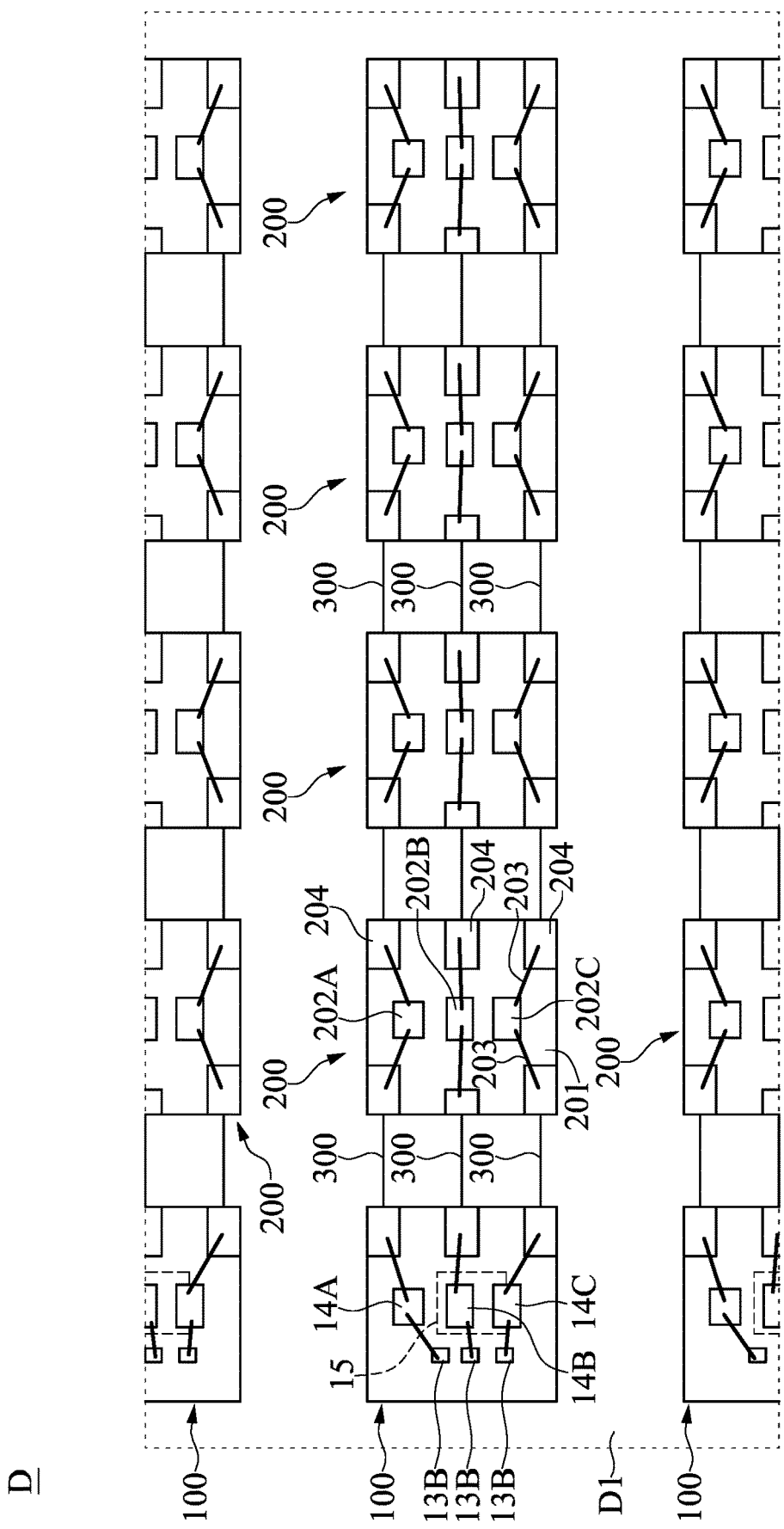
FIG. 13 is a partial top view of a tandem light-emitting device of the present disclosure.
Figure 14:
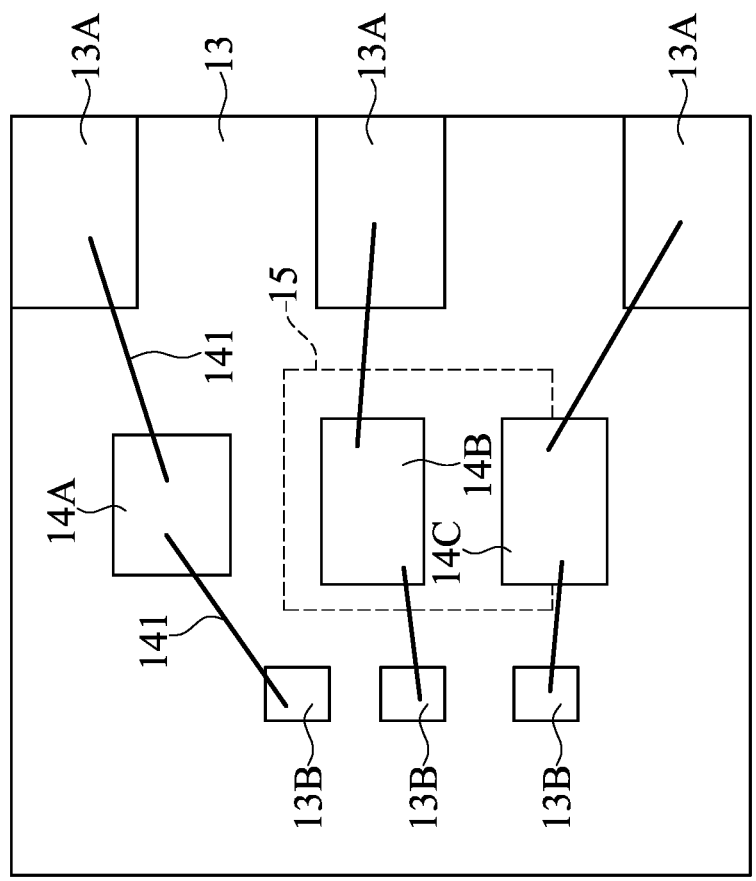
FIG. 14 is a schematic diagram of one light-emitting module of the tandem light-emitting device of the present disclosure.

Referring to FIG. 13 to FIG. 14, FIG. 13 is a partial top view of a tandem light-emitting device of the present disclosure, and FIG. 14 is a schematic diagram of one light-emitting module of the tandem light-emitting device of the present disclosure. As shown in FIG. 13, the display device D includes a circuit board D1 and a plurality of tandem light-emitting devices. Each tandem light-emitting device includes a light-emitting module 100 and at least one tandem module 200, such as four tandem modules 200. Detailed descriptions of the light-emitting module 100 can be referred to in the foregoing embodiment, and are not described herein again. Each tandem module 200 includes at least one second light-emitting unit, such as three second light-emitting units 202A, 202B, and 202C. The second light-emitting units 202A, 202B, and 202C of the four tandem modules 200 are electrically connected in series with the first light-emitting units 14A, 14B, and 14C, respectively.

It should be noted that, in order to clearly illustrate the main features of the embodiment, the light-emitting module 100 shown in FIG. 13 and FIG. 14 only show the substrate 13, three first light-emitting units 14A, 14B, 14C, the control chip 15, and a plurality of metal pads 13A and 13B formed on the substrate 13. The first light-emitting units 14A, 14B, and 14C herein are identical to the light-emitting units 14 described in the previous embodiment. In the present embodiment, the light-emitting units 14 is referred to as the first light-emitting units 14A, 14B, and 14C for the sake of clarity.

In a specific application, the three first light-emitting units 14A, 14B, and 14C may be a first red light emitting diode chip, a first blue light emitting diode chip, and a first green light emitting diode chip. Each of the first light-emitting units 14A, 14B, and 14C may be connected to the two metal pads 13A and 13B through two metal wires 141. The three metal pads 13B may be electrically connected to the control chip disposed on the second mounting surface of the substrate 13 through conductive channels in the substrate 13.

In FIGS. 13 and 14, the first light-emitting units 14A, 14B, and 14C are connected to the metal pads 13A and 13B on the substrate 13 by wire bonding. However, the manner in which the first light-emitting units 14A, 14B, and 14C are mounted on the substrate 13 is not limited thereto. In different applications, the first light-emitting units 14A, 14B, and 14C may also be mounted onto the substrate 13 in a flip-chip manner.

The three second light-emitting units 202A, 202B, and 202C of each tandem module 200 may be a second red light emitting diode chip, a second blue light emitting diode chip, and a second green light emitting diode chip, respectively. The second red light emitting diode chip, the second blue light emitting diode chip, and the second green light emitting diode chip have the same overlapping characteristics as the illumination range of the foregoing light emitting diode chips, and are not described herein again. Each of the tandem modules 200 may be connected to each other in series by a plurality of metal wires 300, and one of the tandem modules 200 is connected to the light-emitting module 100 through a plurality of metal wires 300. That is, the light-emitting module 100 of each tandem light-emitting device in the display device D is electrically connected in series with the plurality of tandem modules 200. The first red light emitting diode chip of each tandem light-emitting device is electrically connected in series with the second red light emitting diode chip, the first blue light emitting diode chip is electrically connected in series with the second blue light emitting diode chip, and first green light emitting diode chip is electrically connected to the second green light emitting diode chip. Thus, the control chip 15 of each light-emitting module 100 can simultaneously control the corresponding light-emitting module 100 and all the tandem module 200 connected in series with the control chip 15.

A design in which the control chip 15 of each light-emitting module 100 can control the corresponding light-emitting module 100 and a plurality of tandem module 200 connected thereto can greatly reduce the number of control chips required for the display device D, thereby reducing the manufacturing cost of the display device D. The complexity of the related circuit design on the circuit board D1 of the display device D can be greatly reduced, thereby improving the manufacturing yield of the display device D and improving the cost-performance ratio of the display device D.

A circuit design of the control chip 15 of each light-emitting module 100 can be designed according to the type and number of the tandem module 200 connected to the light-emitting module 100, that is, the circuit design of the control chip 15 for simultaneously controlling one light-emitting module 100 and the plurality of tandem modules 200 may be different from the circuit design of the control chip 15 for controlling a single light-emitting module 100. In addition, in practical applications, the control chip 15 of each light-emitting module 100 may be connected to a microprocessor, and the microprocessor controls the remaining tandem module 200 through the control chip 15 of each light-emitting module 100.

The number of the tandem modules 200 connected to the respective light-emitting modules 100, and the connection relationship between the plurality of light-emitting modules 100 (in series or in parallel, etc.), in practical applications, may be different based on the display device D, and is not limited herein. In addition, the number of the first light-emitting units 14A, 14B, and 14C included in each light-emitting module 100 may also be changed according to requirements, and is not limited to three; similarly, the number of second light-emitting units included in the tandem module 200 may also vary according to requirements, as long as the number of first light-emitting units and the second light-emitting units included in the tandem module 200 are equal to each other.

Specifically, as shown in FIG. 3, in a practical application, the second groove 102 of each light-emitting module 100 of the display device D of the present embodiment may be located directly below the first groove 101, so that the lower accommodating space 10b is located directly below the upper accommodating space 10a. Thereby, not only can the size of each light-emitting module 100 be greatly reduced, but also the first light-emitting units 14A, 14B, and 14C of the light-emitting module 100 can be located in the center of the light-emitting module 100. Moreover, since each tandem module 200 is a general LED module without a control chip, the second light-emitting units of each tandem module 200 may also be located in the center of the tandem module 200; that is, the first light-emitting units 14A, 14B, and 14C and the second light-emitting units of the display device D can each be located in the center of the corresponding module, so that the display quality of the display device D can be greatly improved.

In detail, the conventional light-emitting module with a built-in driver chip on the market mounts the driver chip and the LED chips on the same plane of the substrate, so that the overall size of the light-emitting module is large. When such conventional light-emitting module is adopted in a display device, since each LED chip cannot be located in the center of the light-emitting module, the problem of color deviation is likely to occur when a user views from a specific angle.

As described above, the first light-emitting units 14A, 14B, and 14C and the control chip 15 of the light-emitting modules 100 of the display device D of the present embodiment are arranged vertically on the substrate 13. Therefore, the overall volume of the light-emitting module 100 is smaller than that of the conventional light-emitting module with the built-in driver chip. Moreover, since the first light-emitting units 14A, 14B, and 14C of the light-emitting module 100 are not disposed on the same side of the substrate 13 as the control chip 15, the first light-emitting units 14A, 14B, and 14C may be located in the center of the light-emitting module 100. Therefore, compared with the display device composed of the above-mentioned conventional light-emitting module with the built-in driver chip, the problem of color deviation will not occur easily in the display device D of the present disclosure.

Figure 15:
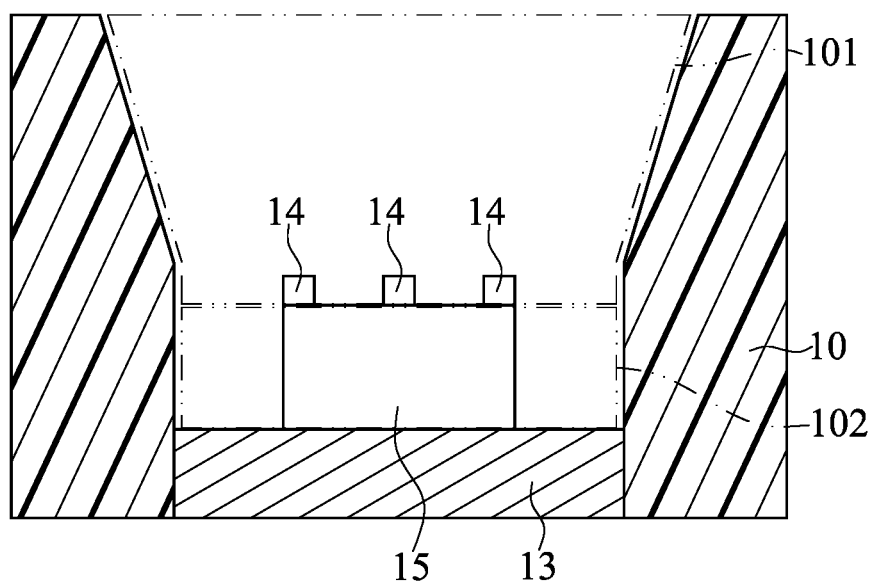
FIG. 15 is a cross-sectional view of a light-emitting module according to a sixth embodiment of the present disclosure.

Referring to FIG. 15, FIG. 15 is a cross-sectional view of a light-emitting module according to a sixth embodiment of the present disclosure. The difference between the present embodiment and the foregoing embodiment is that, the insulating housing 10 surrounds to form the upper accommodating space 10a and the lower accommodating space 10b, the upper accommodating space 10a and the lower accommodating space 10b of the insulating housing 10 are connected to each other, the substrate 13 is disposed at the lower end of the insulating housing 10, and the substrate 13 is located directly below the lower accommodating space 10b. A wide side of the substrate 13 is exposed from the lower accommodating space 10b. The control chip 15 is mounted on the wide side of the substrate 13 exposed from the lower accommodating space 10b, and the light-emitting unit 14 is mounted on the side of the control chip 15 opposite to the substrate 13. In other words, the substrate 13 corresponds to one end of the insulating housing 10, and the substrate 13 and the sidewall of the insulating housing 10 form a groove having the upper accommodating space 10a and the lower accommodating space 10b connected to each other. The control chip 15 is mounted on the wide side of the substrate 13 exposed from the groove, and the light-emitting units 14 are mounted on the side of control chip 15 opposite to the substrate 13.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated.

Alternative embodiments will become apparent to those skilled in the art to which the present disclosure pertains without departing from its spirit and scope.

What is claimed is:

1. A light-emitting module, comprising:
an insulating housing surrounding an upper accommodating space and a lower accommodating space, wherein the lower accommodating space is located directly below the upper accommodating space, and the upper accommodating space is formed with an opening at an upper end of the insulating housing;
a control chip located in the lower accommodating space;
at least one light-emitting unit located in the upper accommodating space and electrically connected to the control chip, wherein a light beam emitted by the light-emitting unit is able to be emitted outwardly through the opening;
a plurality of pins exposed outside the insulating housing, wherein the control chip is able to receive an electrical signal transmitted by an external control device through the pin to control the light-emitting unit to emit the light beam; and
a substrate disposed in the insulating housing and located between the upper accommodating space and the lower accommodating space, wherein two opposite sides of the substrate are defined as a first mounting surface and a second mounting surface, respectively, the first mounting surface is exposed from the upper accommodating space, and the second mounting surface is exposed from the lower accommodating space; wherein the light-emitting unit is mounted onto the first mounting surface, and the control chip is mounted onto the second mounting surface.

2. The light-emitting module according to claim 1, wherein the substrate includes a plurality of conductive channels, the light-emitting unit is electrically connected to the control chip by at least one of the conductive channels, and at least one of the conductive channels is electrically connected to the pin.

3. The light-emitting module according to claim 1, wherein each of the upper accommodating space and the lower accommodating space is filled with a colloid, the light-emitting unit is electrically connected to the first mounting surface through at least one metal wire or solder joint, and the control chip is electrically connected to the second mounting surface through at least one the metal wire or solder joint.

4. The light-emitting module according to claim 1, wherein each of the light-emitting unit and the control chip does not protrude from the insulating housing.

5. The light-emitting module according to claim 1, wherein the number of the at least one light-emitting unit is three, the light-emitting units are a red light emitting diode chip, a blue light emitting diode chip and a green light emitting diode chip, respectively; wherein an illumination range of any one of the red light emitting diode chip, the green light emitting diode chip, and the blue light emitting diode chip, and an illumination range of at least one of the remaining light emitting diode chips partially overlap.

6. A light-emitting module, comprising:
an insulating housing surrounding an upper accommodating space and a lower accommodating space, wherein the lower accommodating space is located directly below the upper accommodating space, and the upper accommodating space is formed with an opening at an upper end of the insulating housing;
a control chip located in the lower accommodating space;
at least one light-emitting unit located in the upper accommodating space and electrically connected to the control chip, wherein a light beam emitted by the light-emitting unit is able to be emitted outwardly through the opening; and
a plurality of pins exposed outside the insulating housing, wherein the control chip is able to receive an electrical signal transmitted by an external control device through the pin to control the light-emitting unit to emit the light beam,
wherein the upper accommodating space is in communication with the lower accommodating space, the light-emitting module further comprises a substrate, the substrate is disposed at a lower end of the insulating housing, a wide side of the substrate is exposed from the lower accommodating space, the control chip is mounted on the wide side of the substrate exposed from the lower accommodating space, and the light-emitting unit is mounted on a side of the control chip opposite to the substrate.

7. A tandem light-emitting device comprising:
a light-emitting module including:
an insulating housing surrounding an upper accommodating space and a lower accommodating space, wherein the lower accommodating space is located directly below the upper accommodating space, and the upper accommodating space is formed with an opening at an upper end of the insulating housing;
a control chip located in the lower accommodating space;
at least one first light-emitting unit located in the upper accommodating space and electrically connected to the control chip, wherein a light beam emitted by the first light-emitting unit is able to be emitted outwardly through the opening;
a plurality of pins exposed outside the insulating housing; and
a substrate disposed in the insulating housing and located between the upper accommodating space and the lower accommodating space, wherein two opposite sides of the substrate are defined as a first mounting surface and a second mounting surface, respectively, the first mounting surface is exposed from the upper accommodating space, and the second mounting surface is exposed from the lower accommodating space; wherein the light-emitting unit is mounted onto the first mounting surface, and the control chip is mounted onto the second mounting surface, and
at least one tandem module including at least one second light-emitting unit, wherein the second light-emitting unit is electrically connected in series with the first light-emitting unit; wherein the control chip is able to receive an electrical signal transmitted by an external control device through the pin to simultaneously control the first light-emitting unit and the second light-emitting unit to emit light.

8. The tandem light-emitting device according to claim 7, wherein the number of the at least one first light-emitting unit is three, the first light-emitting units are a first red light emitting diode chip, a first a blue light emitting diode chip and a first green light emitting diode chip, respectively; wherein an illumination range of any one of the first red light emitting diode chip, the first green light emitting diode chip, and the first blue light emitting diode chip, and an illumination range of at least one of the remaining first emitting diode chips partially overlap; the number of at least one second light-emitting unit is three, the second light-emitting units are a second red light emitting diode chip, a second blue light emitting diode chip and a second green light emitting diode chip, respectively; wherein an illumination range of any one of the second red light emitting diode chip, the second green light emitting diode chip, and the second blue light emitting diode chip, and an illumination range of at least one of the remaining second light emitting diode chips partially overlap; wherein the first red light emitting diode chip is electrically connected in series with the second red light emitting diode chip, the first blue light emitting diode chip is electrically connected in series with the second blue light emitting diode chip, and the first green light emitting diode chip is electrically connected in series with the second green light emitting diode chip.

* * * * *